United States Patent
Heiden

(10) Patent No.: US 7,602,824 B2
(45) Date of Patent: Oct. 13, 2009

(54) DEVICE AND METHOD FOR SUPPLYING SHORT-WAVELENGTH LIGHT

(75) Inventor: Michael Heiden, Woelfersheim (DE)

(73) Assignee: Leica Microsystems CMS GmbH, Wetzlar (DE)

( * ) Notice: Subject to any disclaimer, the term of this patent is extended or adjusted under 35 U.S.C. 154(b) by 190 days.

(21) Appl. No.: 11/400,107

(22) Filed: Apr. 6, 2006

(65) Prior Publication Data

US 2006/0232991 A1    Oct. 19, 2006

(30) Foreign Application Priority Data

Apr. 16, 2005    (DE) .................. 10 2005 017 607

(51) Int. Cl.
*H01S 3/30* (2006.01)
*H01S 3/10* (2006.01)
(52) U.S. Cl. .................. 372/21; 372/5; 372/22
(58) Field of Classification Search .......... 372/21, 372/22, 5
See application file for complete search history.

(56) References Cited

U.S. PATENT DOCUMENTS

| 4,538,278 | A  | * | 8/1985  | Gergely ............... 372/70 |
| 6,208,673 | B1 | * | 3/2001  | Miyake ............... 372/22 |
| 6,822,978 | B2 | * | 11/2004 | Kafka et al. ......... 372/18 |

* cited by examiner

*Primary Examiner*—Armando Rodriguez
(74) *Attorney, Agent, or Firm*—Simpson & Simpson, PLLC

(57) ABSTRACT

The present invention broadly comprises a device for supplying light at an illumination wavelength shorter than 300 nm. The device includes a first subassembly, having a light source for delivering light at a wavelength that is at least twice as long as the illumination wavelength; a second subassembly having at least one means for wavelength reduction; and a light guide that guides the light from the light source of the first subassembly into the second subassembly. The present invention also broadly comprises a method for supplying light at an illumination wavelength shorter than 300 nm.

7 Claims, 2 Drawing Sheets

DEVICE AND METHOD FOR SUPPLYING SHORT-WAVELENGTH LIGHT

CROSS REFERENCE TO RELATED APPLICATIONS

This application claims priority of German patent application 10 2005 017 607.0, filed Apr. 16, 2005, which application is incorporated by reference herein.

FIELD OF THE INVENTION

The invention relates to a device for supplying short-wavelength light at an illumination wavelength shorter than 300 nm, and to a method for supplying short-wavelength light at an illumination wavelength shorter than 300 nm.

BACKGROUND OF THE INVENTION

Examination methods that require the use of electromagnetic waves, in particular short-wavelength light, are used in many ways in the examination of specimens. For example, it is necessary to inspect the results of producing a wafer, e.g., by inspecting layer thicknesses. A plurality of optical measurement arrangements, operating according to the principle of spectrophotometry or ellipsometry, are known from the existing art for the measurement of layer thicknesses. These arrangements allow both the layer thickness and the optical parameters of transparent layers to be determined very accurately. Short-wavelength light, i.e., light at a wavelength of less than 300 nm, is often used for such examinations. This light can derive, for example, from an excimer laser or from a special lamp. The short-wavelength light is often also made available by commercially available illumination sources in which the short wavelength is produced, on the basis of a solid-state laser, by frequency multiplication or by sum frequency mixing. In this process, the wavelength originally generated by the solid-state laser is modified by being conveyed to a device for frequency multiplication, in particular to a frequency doubler or a sum frequency mixer. Such devices make use of nonlinear effects that occur in certain crystals in response to high field strengths, thus generating the short-wavelength light. Examples of such commercially available illumination sources are e.g. the unit marketed by Coherent under the name AZURE 266, which generates a wavelength of 266 nm; or the unit marketed by the same company under the name INDIGU-DUV, which makes available a wavelength of 193 nm. These illumination sources are encapsulated in a housing as a complete assemblage, so that only the indicated nominal wavelength is therefore accessible and available at the exit of the illumination source.

As a result of stringent requirements in terms of reproducibility and accuracy, modern measurement systems for the semiconductor industry are nowadays usually installed in climate-controlled chambers. An important criterion is that, whenever possible, all heat sources that might negatively influence the measurement results are provided outside the climate-controlled chamber. In addition to electronics, these heat sources also include the illumination device, i.e., for example, the solid-state laser with the device for frequency multiplication. The illumination device is therefore positioned outside the chamber, and the light is coupled into a light-guiding fiber, for example, a quartz glass fiber. The light exit end of the fiber is guided to the measurement head in the climate-controlled chamber. An additional result of this is that vibration isolation of the illumination source can be dispensed with.

When short-wavelength light (at a wavelength shorter than 300 nm) is transmitted in a light guide, however, the relatively high absorptivity of the fiber means that the transmission length is very limited. In addition, the fiber ages relatively quickly as a result of, for example, color centers present in the fiber. The absorption of the short-wavelength light in the fiber thus rises even further.

SUMMARY OF THE INVENTION

It is therefore the object of the present invention to propose a device for supplying short-wavelength light as well as a method for supplying short-wavelength light, in particular for the examination of specimens, the thermal influence of the illumination device being reduced and the service life of the device nevertheless being improved.

This object is achieved, according to the present invention, by a device for supplying light at an illumination wavelength shorter than 300 nm comprising: a first subassembly, having a light source for delivering light at a wavelength that is at least twice as long as the illumination wavelength; a second subassembly having at least one means for wavelength reduction; and a light guide that guides the light from the light source of the first subassembly into the second subassembly.

Additionally, the object is achieved by a method for supplying light at an illumination wavelength shorter than 300 nm comprises the steps of:
  providing a light source for delivering light at a wavelength that is at least twice as long as the illumination wavelength;
  delivering light from a first subassembly to a second subassembly via a light guide; and,
  generating in the second subassembly an illumination wavelength shorter than 300 nm, wherein the second subassembly comprises at least one means for wavelength reduction.

The device according to the present invention accordingly comprises a light source, in particular, a laser. A first subassembly encompasses the light source for delivering light at a wavelength that is at least twice as long as the illumination wavelength. A second subassembly has at least one means for wavelength reduction. The light from the light source of the first subassembly is directed by a light guide into the second subassembly. The second subassembly is preferably housed in a climate-controlled chamber. In the second subassembly, the means for wavelength reduction is a frequency doubler. The means for wavelength reduction can also be a sum frequency mixer. The light source is a laser. In a further embodiment, in the first subassembly a frequency doubler can be placed after the light source.

With this device, short-wavelength light can be obtained from a laser, such as e.g. a solid-state laser, gas laser, or semiconductor laser, by the fact that two subassemblies are used. In the first subassembly, light of a long wavelength is generated and is subsequently conveyed to a second subassembly, There the desired short-wavelength light is generated from the long-wavelength light. The two subassemblies are coupled to one another via a light guide.

In a preferred embodiment of the invention a frequency doubler, which operates, in particular, on the basis of nonlinear effects in a crystal under the influence of high field strengths, is used as the means for wavelength reduction. The frequency multiplier can also be implemented using a sum frequency mixer, or combined with it.

The device and the method according to the present invention for supplying short-wave light furthermore make it possible to arrange the heat-generating light source outside the climate-controlled chamber. At the same time, however, absorption of the light transmitted in the light guide is decreased, since longer light waves are now being transmitted therein and the losses in the fiber are therefore lower. Longer transmission distances can thus also be implemented, so that essentially more freedom exists in terms of arranging the illumination source relative to the measurement device.

With appropriate selection of a laser, not only the illumination source but also a first frequency multiplier, in particular, a frequency doubler, can be provided in the first subassembly, so that the wavelength generated in the laser is made smaller even before entering the optical waveguide. In this case a further frequency multiplier is additionally provided in the second subassembly, i.e., on the light exit side of the light guide, in the vicinity of the measurement point. A simpler design for the frequency multiplier in the vicinity of the measurement point is thus possible, so that space can be saved in this context.

BRIEF DESCRIPTION OF THE DRAWINGS

Further advantages and advantageous embodiments of the invention are the subject matter of the Figures that follow and of their descriptions, in whose depictions accurately scaled reproduction has been dispensed with in the interest of clarity.

In the individual Figures.

DETAILED DESCRIPTION OF THE INVENTION

Figure 1:
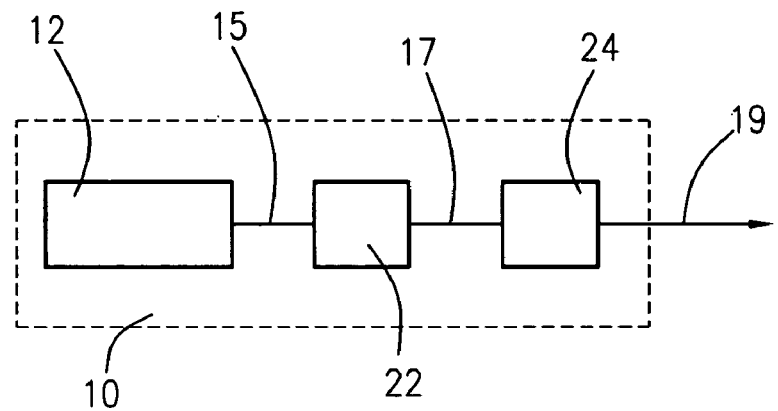
FIG. 1 schematically shows a device according to the existing art for supplying short-wavelength light.

FIG. 1 shows a device 10 according to the existing art for supplying short-wavelength light.

A device 10 comprises a light source 12 that is preferably constituted by a laser. A light beam 15 at a wavelength $\lambda_0$ emerges from light source 12. Light beam 15 is conveyed, still inside device 10, to a frequency doubler 22. Inside device 10, a light beam 17 at a wavelength $\lambda_1$, which typically corresponds to half of wavelength $\lambda_0$, emerges from frequency doubler 22. Light beam 17 having wavelength $\lambda_1$ can then be conveyed to a sum frequency mixer 24 as a second frequency multiplication stage. A light beam 19 at a wavelength $\lambda_2$, whose frequency has likewise been multiplied with respect to wavelength $\lambda_1$, then emerges from the second stage. The frequency multiplication in frequency doubler 22 or in sum frequency mixer 24 is based on nonlinear optical effects that occur in crystals at high light field strengths. In illumination devices 10 known from the existing art, the entire assemblage is accommodated in encapsulated fashion in a housing of the illumination device. Only the actual nominal wavelength of the illumination device, i.e., the light of wavelength $\lambda_2$ in the example shown, is therefore accessible.

A solid-state laser, for example a Nd:YAG laser having a basic wavelength $\lambda_0$ equal to 1064 nm, is typically used for the assemblage described above. The use of frequency doubler 22 generates a wavelength $\lambda_1$ equal to 532 nm. From that, depending on whether a further optionally present second stage for frequency multiplication, for example, mixer 24, is provided, a wavelength $\lambda_2$ equal to 266 nm (with frequency doubling) or to 193 nm (with sum frequency calculation) is generated. The wavelength emerging from the illumination device is then guided via an optical waveguide, for example a quartz glass fiber, to the measurement point. Because of the short wavelength, however, the quartz glass fiber is damaged relatively quickly, so that the already high absorption of the light in the glass fiber becomes even greater. Device 10 can also be provided directly in the climate-controlled chamber in which the measurement point is also located. This arrangement results in a temperature input into the climate-controlled chamber.

Figure 2:
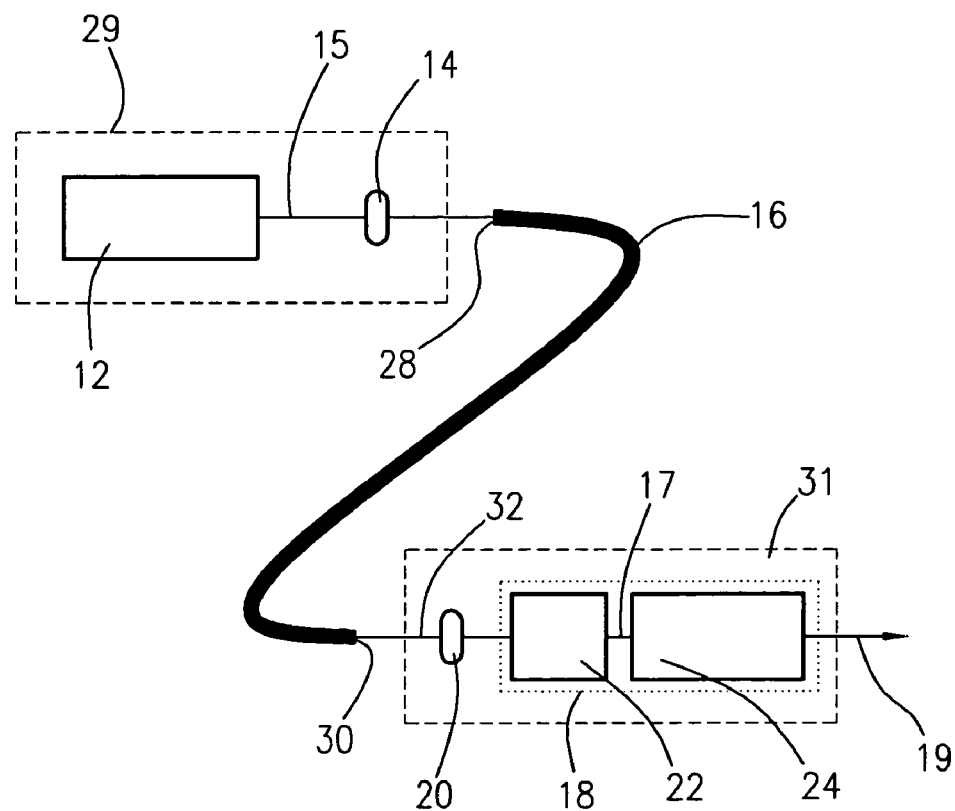
FIG. 2 schematically shows a present invention device for supplying short-wavelength light; and, FIG. 3 schematically shows an alternative embodiment of a device according to the present invention for supplying short-wavelength light.

A first embodiment of the device according to the present invention for supplying short-wavelength light is depicted in FIG. 2. For this purpose, in essence, an existing system for generating short-wavelength light is divided into two subassemblies. The first, primary subassembly 29 comprises light source 12, which generates light at a long wavelength. In the second, secondary subassembly 31, a means 18 for wavelength reduction is provided that is separate from first subassembly 29. Here the light at the wavelength to be used for measurement is generated. The two subassemblies 29, 31 are coupled to one another via a light-guiding fiber 16. A laser, from which a light beam 15 at a wavelength $\lambda_0$ emerges, is correspondingly provided in device 10 as light source 12. This light beam 15 is conveyed via an incoupling optical system 14 to a light guide 16; light beam 15 enters optical waveguide input 28, and emerges at the end of light guide 16 from optical waveguide output 30. Light beam 32 emerging from optical waveguide output 30 is conveyed to means 18 for wavelength reduction, which is provided in second subassembly 31. Provided in second subassembly 31 is an optical incoupling apparatus 20 that conveys light beam 32 to means 18 for wavelength reduction. Means 18 for wavelength reduction comprises, for example, a frequency doubler 22. Light 17 of a wavelength $\lambda_1$ emerges from frequency doubler 22 and can then be conveyed to an optional sum frequency mixer 24 provided in means 18 for wavelength reduction. This means 18 for wavelength reduction can be embodied as a frequency doubler or as a sum frequency mixer. What emerges after this second stage is light 19 at a wavelength $\lambda_2$ that exhibits a short wavelength, i.e., a wavelength of less than 300 nm, for examination of the specimen. With coupling optical system 20 it is possible to adapt light beam 32 emerging from fiber 16 to the requirements of frequency doubler 22 and/or sum frequency mixer 24 provided in means 18 for wavelength reduction.

Figure 3:
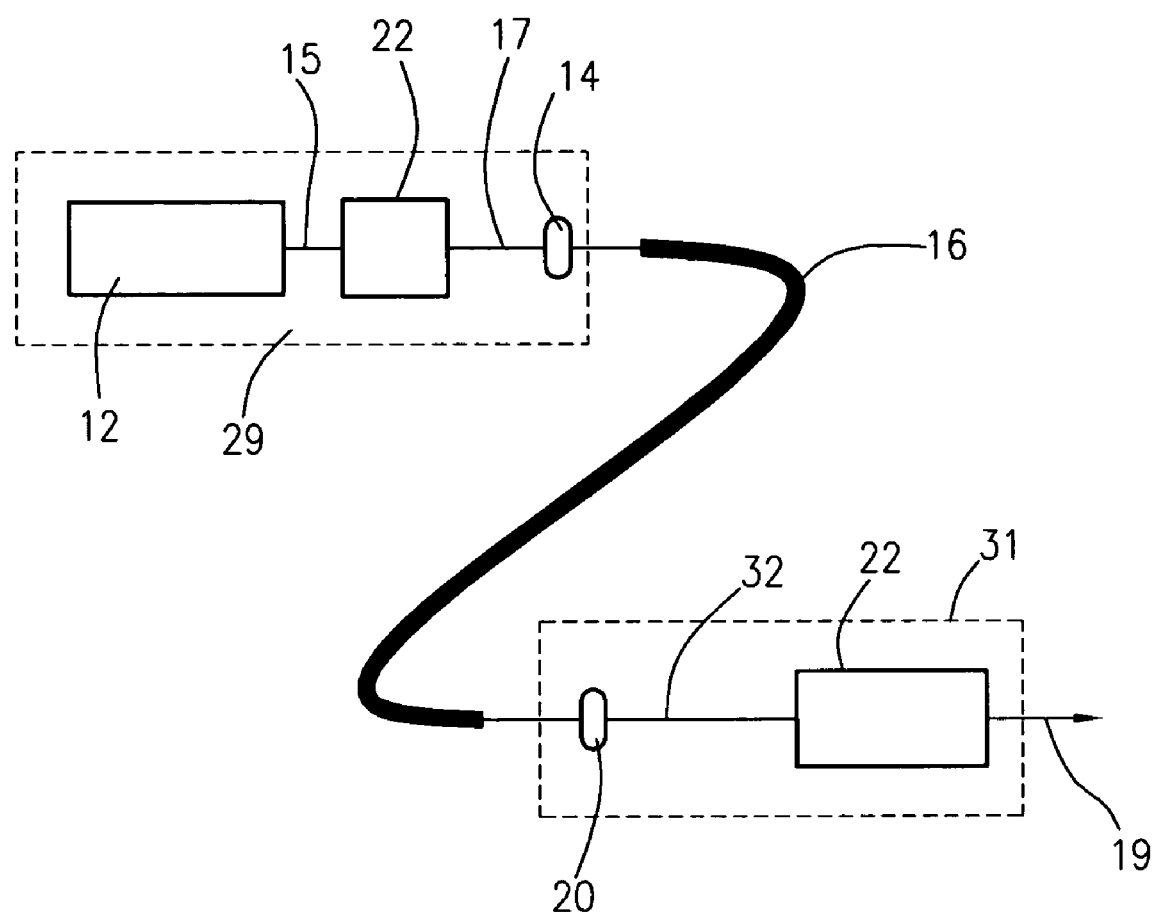

FIG. 3 schematically depicts a further embodiment of a device according to the present invention for supplying short-wavelength light. In this embodiment there is again a division into two subassemblies, first subassembly 29 containing light source 12 and second subassembly 31 containing means 18 for wavelength reduction, first subassembly 29 being connected to second subassembly 31 via a light-guiding fiber 16. First subassembly 29 comprises, as light source 12, a laser that once again delivers light 15 of a wavelength $\lambda_0$. This light 15 is then conveyed, still in first subassembly 29, to a frequency doubling unit 22 from which light 17 of a wavelength $\lambda_1$ then emerges. An incoupling optical system 14, for coupling the light into a light guide 16, is preferably provided in the interior of first subassembly 29. Light 32 emerges at the end of light guide 16 and is conveyed to second subassembly 31. In second subassembly 31, an outcoupling optical system 20, for adapting the fiber to the crystals provided in the frequency multiplication system, is preferably arranged. Second subassembly 31 comprises a frequency doubling device and/or a sum frequency mixer, a frequency doubler 22 having been used in the present example. Light 19 of a wavelength $\lambda_2$ emerges from frequency doubler 22 and is then available for measurement. It is advisable to use the alternative form of the invention depicted in FIG. 3 whenever first frequency multiplication system 22 in device 10 generates a wavelength that can easily be transmitted with fiber 16 that is used. The advantage that means 18 for wavelength reduction usable in the measurement head can be of simpler configuration can thereby still be obtained.

With the device according to the present invention for supplying short-wavelength light, as presented above, it is also possible to use more-economical fibers to transmit the light, since a direct transmission of the DUV wavelength can be avoided. Because it is now possible to make light guide 16 longer, the relative positioning of the laser and measurement head with respect to one another can moreover be handled in more variable fashion. There is moreover no need to isolate the illumination device, with the laser device present in it, in terms of vibration. Temperature input into the climate-controlled chamber is likewise avoided.

What is claimed is:

1. A device for supplying short-wavelength light at an illumination wavelength shorter than 300 nm, comprising: a first subassembly, having a light source for delivering light at a wavelength that is at least twice as long as the illumination wavelength; a second subassembly having at least one means for wavelength reduction; and a light guide that guides the light from the light source of the first subassembly into the second subassembly, wherein the at least one means for wavelength reduction comprises a sum frequency mixer and a frequency doubler.

2. The device according to claim 1, wherein the light source is a laser.

3. The device according to claim 1, wherein in the first subassembly a frequency doubler is placed after the light source.

4. A method for supplying light at an illumination wavelength shorter than 300 nm comprises the steps of:
   providing a light source for delivering light at a wavelength that is at least twice as long as the illumination wavelength,
   delivering the light from a first subassembly to a second subassembly via a light guide; and,
   generating in the second subassembly an illumination wavelength shorter than 300 nm, wherein the second subassembly comprises at least one means for wavelength reduction and the at least one means for wavelength reduction comprises a sum frequency mixer and a frequency doubler.

5. The method according to claim 4, wherein a frequency multiplication is additionally performed in the first subassembly.

6. The device according to claim 1, wherein said first subassembly is arranged in a first location, said second subassembly is arranged in a second location and said first location is isolated from said second location.

7. The method according to claim 4, wherein said first subassembly is arranged in a first location, said second subassembly is arranged in a second location and said first location is isolated from said second location.

* * * * *